United States Patent
Aratani et al.

(10) Patent No.: US 8,158,969 B2
(45) Date of Patent: Apr. 17, 2012

(54) ORGANIC LIGHT EMITTING DISPLAY DEVICE

(75) Inventors: Sukekazu Aratani, Hitachiota (JP); Hajime Murakami, Tokyo (JP); Masao Shimizu, Hitachi (JP); Kazuhito Masuda, Hitachi (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 0 days.

(21) Appl. No.: 11/435,975

(22) Filed: May 18, 2006

(65) Prior Publication Data
US 2006/0260679 A1 Nov. 23, 2006

(30) Foreign Application Priority Data
May 20, 2005 (JP) ................................. 2005-147501

(51) Int. Cl.
H01L 51/54 (2006.01)
(52) U.S. Cl. .................... 257/40; 257/E51.018; 313/504
(58) Field of Classification Search .................... 257/40, 257/E51.001–E51.052; 438/99; 313/503–504, 313/509
See application file for complete search history.

(56) References Cited

U.S. PATENT DOCUMENTS

| | | | | |
|---|---|---|---|---|
| 5,989,738 A * | 11/1999 | Haase et al. | | 428/690 |
| 6,013,538 A * | 1/2000 | Burrows et al. | | 438/22 |
| 6,137,223 A | 10/2000 | Hung et al. | | |
| 6,366,017 B1 * | 4/2002 | Antoniadis et al. | | 313/506 |
| 6,548,956 B2 * | 4/2003 | Forrest et al. | | 313/504 |
| 6,882,105 B2 * | 4/2005 | Murakami et al. | | 313/506 |
| 7,696,681 B2 * | 4/2010 | Park | | 313/503 |
| 7,898,168 B2 * | 3/2011 | Seo et al. | | 313/504 |
| 2004/0241492 A1 * | 12/2004 | Tokuda et al. | | 428/690 |
| 2005/0084712 A1 * | 4/2005 | Kido et al. | | 428/690 |
| 2005/0088083 A1 * | 4/2005 | Seo et al. | | 313/504 |
| 2005/0095842 A1 * | 5/2005 | Ishikawa et al. | | 438/625 |

(Continued)

FOREIGN PATENT DOCUMENTS

EP 1083776 A1 * 3/2001

(Continued)

OTHER PUBLICATIONS

Shirota, Y. and Kageyama, H. "Charge Carrier Transporting Molecular Materials and Their Applications in Devices." Chem. Rev., vol. 107 (2007): pp. 953-1010.*

(Continued)

*Primary Examiner* — Matthew W Such
(74) *Attorney, Agent, or Firm* — Antonelli, Terry, Stout & Kraus, LLP.

(57) ABSTRACT

The present invention is intended to provide a top emission type organic light emitting display device which prevents the organic film from being oxidized during the formation of the upper transparent electrode and can emit light at a low voltage. The top emission type organic light emitting display device includes: a substrate; an organic light emitting layer; and upper and lower electrodes sandwiching the organic light emitting layer, where the lower electrode is arranged between the substrate and the organic light emitting layer, the upper electrode is arranged on the opposite side of the substrate with respect to the lower electrode, light emitted from the organic light emitting layer is taken out from the upper electrode side, and an organic layer which is mainly composed of an organic material having a heterocyclic group containing one or more nitrogen atoms, is included between the organic light emitting layer and the upper electrode.

7 Claims, 7 Drawing Sheets

U.S. PATENT DOCUMENTS

| | | | |
|---|---|---|---|
| 2005/0098207 A1* | 5/2005 | Matsumoto et al. | 136/263 |
| 2005/0116633 A1* | 6/2005 | Yamazaki et al. | 313/506 |
| 2005/0162075 A1* | 7/2005 | Madathil et al. | 313/504 |
| 2005/0208330 A1* | 9/2005 | Raychaudhuri et al. | 428/690 |
| 2005/0212003 A1* | 9/2005 | Murakami et al. | 257/98 |
| 2006/0008740 A1* | 1/2006 | Kido et al. | 430/296 |
| 2006/0011908 A1* | 1/2006 | Ohsawa et al. | 257/40 |
| 2006/0035015 A1* | 2/2006 | Raychaudhuri et al. | 427/66 |
| 2006/0119255 A1* | 6/2006 | Kimura | 313/504 |
| 2006/0125387 A1* | 6/2006 | Adachi et al. | 313/506 |
| 2006/0261328 A1* | 11/2006 | Nakaya et al. | 257/40 |

FOREIGN PATENT DOCUMENTS

| | | |
|---|---|---|
| JP | 2000-058265 | 2/2000 |
| JP | 2005-032618 | 2/2005 |
| JP | 2005-123095 | 5/2005 |
| WO | WO 2005031798 A2 * | 4/2005 |
| WO | WO 2005076753 A2 * | 8/2005 |

OTHER PUBLICATIONS

Tokita, S., et al. "Metal Oxides as a Hole-Injecting Layer for an Organic Electroluminescent Device." J. Phys. D: Appl. Phys., vol. 29 (1996): pp. 2750-2753.*

Handbook of Chemistry and Physics. 57th Ed. CRC Press, Inc. (1976): pp. D-61 to D-78.*

Hill, I.G., et al. "Organic Semiconductor Interfaces: Electronic Structure and Transport Properties." Appl. Surf. Sci., vol. 166 (2000): pp. 354-362.*

Li, F., et al. "Fabrication and Electroluminescence of Double-Layered Organic Light-Emitting Diodes with the Al2O3/Al Cathode." Appl. Phys. Lett., vol. 70 (1997): pp. 1233-1235.*

Tanaka, K., et al. "Organic EL Device Using SrOx as an Electron Injection Material." Elect. Comm. Jpn. Part 2, vol. 86 (2003): pp. 73-80.*

Callister, Jr., W.D. Materials Science and Engineering: An Introduction. 3rd Ed. John Wiley & Songs, Inc.: New York (1994): pp. 774 and 785.*

Hung, L.S., et al. "Anode Modification in Organic Light-Emitting Diodes by Low-Frequency Plasma Polymerization of CHF3." Appl. Phys. Lett., vol. 78, No. 5 (Jan. 29, 2001): pp. 673-675.*

Zhang, S.T., et al. "Buffer-Layer-Induced Barrier Reduction: Role of Tunneling in Organic Light-Emitting Devices." Appl. Phys. Lett., vol. 84 (2004): pp. 425-427.*

V. Bulović, et al, "A Surface-Emitting Vacuum-Deposited Organic Light Emitting Device" appearing in Appl. Phys. Lett. 70 (22), Jun. 2, 1997, pp. 2954-2956.

* cited by examiner

ORGANIC LIGHT EMITTING DISPLAY DEVICE

FIELD OF THE INVENTION

The present invention relates to an organic light emitting display device.

BACKGROUND OF THE INVENTION

Recently, an organic light emitting display device has been paid attention to as a next-generation flat type display device. The organic light emitting display device has excellent properties such as a self-luminous property, a wide viewing angle property, and a high-speed response property.

The structures of prior art organic light emitting devices are configured to form a glass substrate on which a first electrode consisting of ITO or the like; an organic layer consisting of a hole transport layer, a light emitting layer, and an electron transport layer, or the like; and an upper electrode having a low work function, and the emitted light passes through the first electrode having a transparency and is taken out from the rear surface of the substrate.

However, if an active matrix which has the advantage of having a higher precision and larger image plane as compared to a simple matrix is used, the aperture ratio is limited in an organic light emitting display device which takes out emitted light from the rear surface of a substrate. Especially, in a large-screen display device, in order to reduce brightness fluctuation among pixels due to voltage dropping of a power line, it is required to widen the width of the power line, thereby resulting in an extremely small aperture ratio.

In the circumstances, there is an approach for taking out emitted light from the upper electrode side by making the upper electrode transparent. If the upper electrode is made to be transparent, the upper electrode is formed by a sputter film deposition process using an indium-oxide based oxide such as ITO or IZO.

As for such an organic light emitting element of top emission type, the following patent document 1 JP-A-2000-58265) discloses an organic light emitting element having an organic cathode buffer layer on an organic light emitting structure, as a protection layer against damage caused by depositing a high energy with the cathode.

In an organic light emitting element having a top emission type structure, it is required for a layer inserted between the upper electrode and an organic film to have a thin film thickness in order to avoid problems such as low transmission or low conductivity. Therefore, when the upper electrode is formed, it is not possible to prevent the organic film from being oxidized, thereby resulting in a problem that the light emission voltage increases.

According to the above-mentioned patent document 1, although the organic buffer layer can be protected from the damage during the high energy deposition, the buffer layer itself is oxidized during the formation of the upper electrode. As a result, the increase of the light emission voltage cannot be avoided.

BRIEF SUMMARY OF THE INVENTION

The object of the present invention is to prevent an organic film from being oxidized during the formation of an upper transparent electrode, and is to provide a top emission type organic light emitting display device that can emit light at a low voltage.

Other objects, features and advantages of the invention will become apparent from the following description of the embodiments of the invention taken in conjunction with the accompanying drawing.

DESCRIPTION OF REFERENCE NUMERALS

Figure 1:
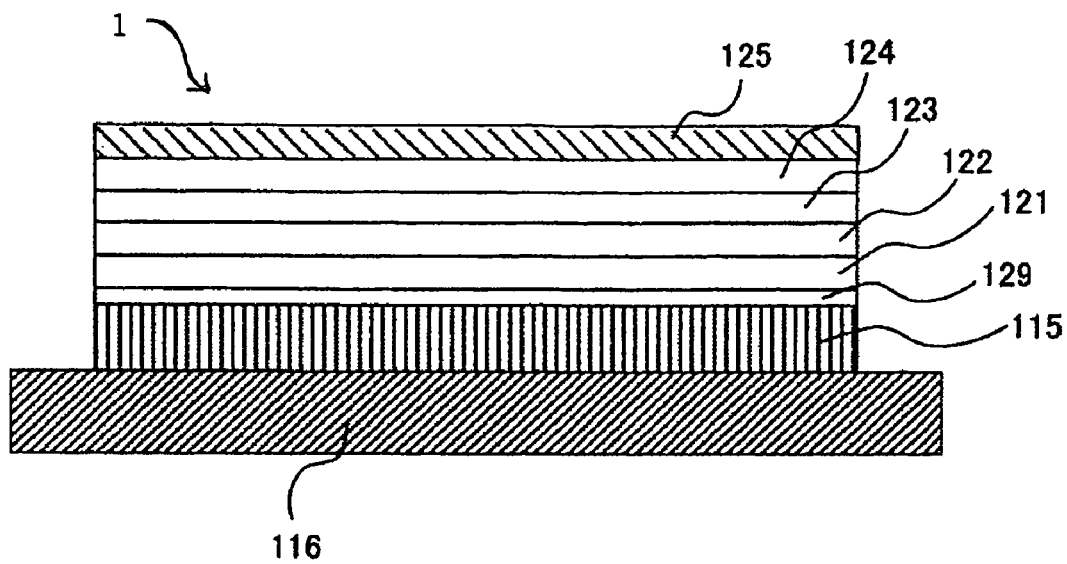
FIG. 1 is a sectional view showing one example of an organic light emitting display device according to the present invention.

105 . . . lower capacitor electrode
108 . . . upper capacitor electrode
109 . . . signal line
110 . . . power line
115 . . . lower electrode
116 . . . substrate
117 . . . gate insulating film
118 . . . first interlayer insulating film
119 . . . second interlayer insulating film
120 . . . third interlayer insulating film
121 . . . hole transport layer
122 . . . organic light emitting layer
123 . . . electron transport layer
124 . . . electron injection layer
125 . . . upper electrode
126 . . . protection layer
127 . . . buffer layer
128 . . . auxiliary electrode 129 . . . hole injection layer
136 . . . flattened layer
200 . . . reflection electrode

DETAILED DESCRIPTION OF THE INVENTION

In order to achieve the above-mentioned object, the organic light emitting display device according to the present invention includes a substrate, an organic light emitting layer, and upper and lower electrodes. The lower electrode and the organic light emitting layer are arranged between the substrate and the upper electrode, the lower electrode is arranged between the substrate and the organic light emitting layer, and light emitted from the organic light emitting layer is taken out from the upper electrode side. An organic layer which is mainly composed of an organic material that has a heterocyclic group containing one or more nitrogen atoms is included between the organic light emitting layer and the upper electrode.

Moreover, the organic light emitting display device includes a substrate, an organic light emitting layer, and the upper and lower electrodes sandwiching the organic light emitting layer. The lower electrode is arranged between the substrate and the organic light emitting layer, the upper electrode is arranged on the opposite side of the substrate with respect to the lower electrode, the light which is emitted from the organic light emitting layer is taken out from the upper electrode side, and an organic layer which is mainly composed of an organic material that has a working function of 5.4 eV or more is included between the organic light emitting layer and the upper electrode.

Further, a buffer layer which is mainly composed of an oxide that has a Gibbs energy of formation near the melting point lower than −300 kJ/mol is included between the organic layer and the upper electrode.

The examples according to the present invention will be described by using drawings.

Example 1

Hereinafter, the example of the organic light emitting display device according to the present invention will be described.

FIG. 1 is a sectional view of the organic light emitting display device of this example.

In one embodiment in FIG. 1, a structure of a top emission type display device that takes out the light emitted from an organic light emitting layer from the upper electrode side is shown, where a lower electrode 115, a hole injection layer 129, a hole transport layer 121, an organic light emitting layer 122, an electron transport layer 123, an electron injection layer 124, and an upper electrode 125 are arranged on a substrate 116 in this order. In this configuration, the lower electrode is an anode, and the upper electrode is a cathode.

The present invention is characterized in that an organic layer which is mainly composed of an organic material having a heterocyclic group containing one or more nitrogen atoms is included between the organic light emitting layer 122 and the upper electrode 125.

The lower electrode 115, the hole injection layer 129, the hole transport layer 121, the organic light emitting layer 122, the electron transport layer 123, the electron injection layer 124, and the upper electrode 125 are collected together, and the collection of them is used as an organic light emitting element.

As for the hole injection layer 129, in order to reduce the injection barrier between the anode and the hole transport layer, a material having a suitable ionization potential is desirable. Specifically, copper phthalo-cyanine, star burst amine compound, polyaniline, polythiophene, and the like are included, however, the material is not limited to these materials. Moreover, it is desirable that the hole injection layer is doped with a hole donating dopant. Specifically, as for the hole donating dopant, 2,3,5,6-tetrafluoro-tetracyanoquinodimethane (F4-TCNQ), iron chloride, and dicyano-dichloroquinone are desirable. Moreover, the dopant is not limited to these materials, and two or more of them may be used simultaneously.

Moreover, the hole transport layer 121 has a function to transport holes and inject them into the light emitting layer, therefore it is desirable for the hole transport layer to have high hole mobility and to be chemically stable, and further to have a high glass-transition temperature. Specifically, N,N'-bis(3-methylphenyl)-N,N'-diphenyl-[1,1'-biphenyl]-4,4'-diamine (TPD), 4,4'-bis[N-(1-naphtyl)-N-phenylamino]biphenyl (α-NPD), 4,4',4"-tri(N-carbazolyl)triphenylamine (TCTA), and 1,3,5-tris[N-(4-diphenylaminophenyl)phenylamino]benzene (p-DPA-TDAB) are desirable.

Moreover, the hole transport layer is not limited to these materials, and two or more of them may be used simultaneously.

Moreover, the organic light emitting layer 122 is referred to as a layer, where the injected holes and electrons recombine, and which emits light at a wavelength specific to the material of the layer. There are two cases of light emission. In one case, the host material, forming the light emitting layer, itself emits light, and in the other case, a small amount of doped dopant material emits light. As for a specific host material, distyrylarylene derivatives (DPVBi), silole derivatives with benzene ring skeleton (2PSP), oxodiazole derivatives having a triphenylamine structure on both ends (EM2), perynone derivatives having phenanthrene groups (P1), oligothiophene derivatives having a triphenylamine structure on both ends (BMA-3T), perylene derivatives (tBu-PTC), tris(8-quinolinol) aluminum, poly-paraphenylene-vinylene derivatives, polythiophene derivatives, poly-paraphenylene derivatives, polysilane derivatives, and polyacetylene derivatives are desirable. Moreover, the host material is not limited to these materials, and two or more of them may be used simultaneously.

Thus, as for a specific dopant material, quinacridone, coumarin 6, Nile red, rubrene, 4-(dicyanomethylene)-2-methyl-6-(para-dimethylaminostyryl)-4H-pyran (DCM), and dicarbazole derivatives are desirable. Moreover, the dopant material is not limited to these materials, and two or more of them may be used simultaneously.

The electron transport layer 123 has a function to transport electrons and inject them into the light emitting layer. Therefore, it is desirable for the electron transport layer to have high electron mobility. Specifically, tris(8-quinolinol) aluminum, oxadiazole derivatives, silole derivatives, and zinc-benzothiazole complexes are desirable. Moreover, the electron transport layer is not limited to these materials, and two or more of them may be used simultaneously. However, the feature of the present invention is to use such organic materials that include a heterocyclic group having one or more nitrogen atoms.

The electron injection layer 124 is an organic compound doped with an electron donating dopant and is used in order to improve the efficiency of electron injection from the cathode into the electron transport layer. As for the electron donating dopant, specifically, lithium, magnesium, calcium, strontium, barium, magnesium, aluminum, alkali metal compounds, alkaline-earth metal compounds, rare-earth metal compounds, organic metallic complexes containing alkali metal ions, organic metallic complexes containing alkaline-earth metal ions, and organic metallic complexes containing rare-earth metal ions are desirable. Of course, the electron donating dopant is not limited to these materials, and two or more of them may be used simultaneously. As for the host material of the electron injection layer 124, specifically, tris(8-quinolinol) aluminum, oxadiazole derivatives, silole derivatives, and zinc-benzothiazole complexes are desirable. Of course, the materials usable for the host material of the electron injection layer are not limited to these materials, and two or more of them may be used simultaneously.

In the above-mentioned configuration, a structure without the electron injection layer 124 or the hole injection layer 129 is also conceivable, and a structure without the electron transport layer 123 or the hole transport layer 121 is also conceivable.

The lower electrode and the upper electrode are respectively referred to as an electrode that is included between the organic light emitting layer and the substrate, and an electrode that is provided at a side of the organic light emitting layer opposite a side thereof which is facing toward the substrate, and the pair of electrodes are sandwiching the organic light emitting layer.

The lower electrode 115 is a Cr film formed by means of EB evaporation. Its pattern was formed using a shadow mask, and the thickness of the film was set to be 100 nm. As for the anode material to be used for the lower electrode 115, a conductive film having a large work function so as to enhance the hole injection efficiency, is desirable. Specifically, metals such as molybdenum, nickel, and chromium, alloys using these metals, and inorganic materials such as polysilicon, amorphous silicon, tin oxide, indium oxide, and indium/tin oxide (ITO) are included, but the anode material is not limited to these materials. $In_2O_3$—$SnO_2$ based conductive film, when produced in a condition where the substrate temperature is raised to an order of 200° C., enters polycrystalline state. Since in the polycrystalline state, etching ratio differs between the inside of the crystal grain and the crystal grain boundary surface, when used as the lower electrode, the film is desirably in amorphous state.

Next, a co-evaporated film, which has 10 nm thickness, of F4-TCNQ and copper-phthalocyanine was formed by means of a two-source simultaneous vacuum evaporation process. Its pattern was formed using a shadow mask. The molar ration of F4-TCNQ and copper-phthalocyanine was set to 1:1. This co-evaporated film acts as the hole injection layer 129.

Thus, a film, which has 50 nm thickness, of 4,4-bis[N-(1-naphthyl)-N-phenylamino]biphenyl (hereinafter abbreviated as α-NPD film) was formed by means of a vacuum evaporation process. Its pattern was formed using a shadow mask. The evaporation region was 1.2 times each edge of the lower electrode. This α-NPD film acts as a hole transport layer 121.

On the hole transport layer 121, a co-evaporated film, which has 20 nm thickness, of tris(8-quinolinol) aluminum (hereinafter abbreviated as Alq) and quinacridone (hereinafter abbreviated as Qc) was formed by means of a two-source simultaneous vacuum evaporation process with the evaporation rate controlled at 40:1. This co-evaporated film of Alq and Qc acts as a light emitting layer 122. Its pattern was formed using a shadow mask.

On the light emitting layer 122, an Alq film having 10 nm thickness was formed by a vacuum evaporation process. This Alq film acts as an electron transport layer 123. Its pattern was formed using a shadow mask.

Next, a 10 nm of Alq film doped with Li was formed as an electron injection layer 124 by means of a two-source simultaneous vacuum evaporation process. The molar ratio of Alq and Li was set to 1:1. Its pattern was formed using a shadow mask.

As for an upper electrode 125, a film, which has 100 nm thickness, of In—Zn—O (hereinafter abbreviated as IZO film) was formed by means of a sputtering process. This film acts as the upper electrode 125, and is an amorphous oxide film. A target with a composition of In/(In+Zn)=0.83 was used. The film was formed in an $Ar/O_2$ mixed gas atmosphere under a vacuum pressure of 1 Pa at a sputtering output of 0.2 $W/cm^2$. This upper electrode 125 consisting of the In—ZnO film acted as a cathode, and its transmittance was 80%. This element is referred to as an element 1.

Figure 2:
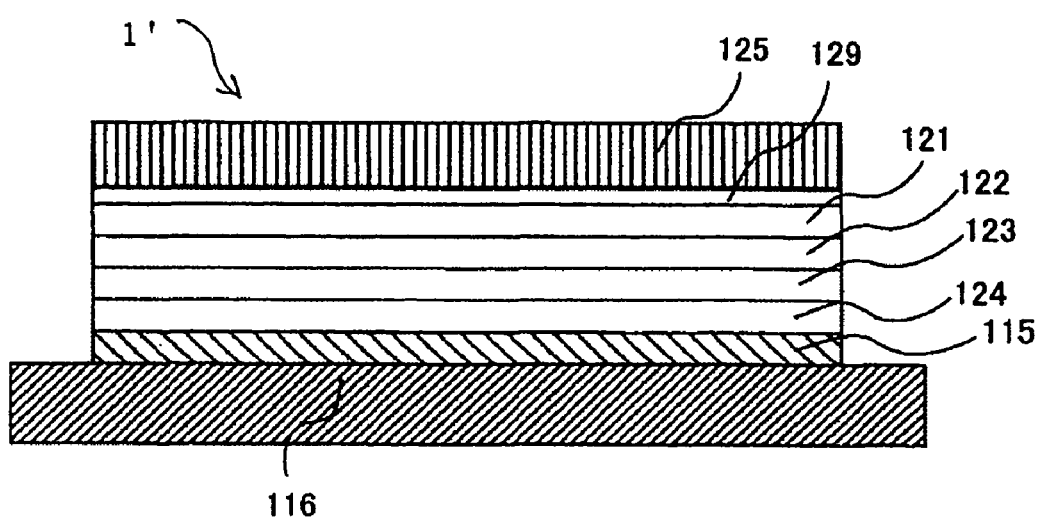
FIG. 2 is a sectional view showing one example of a bottom emission type organic light emitting display device for comparison to FIG. 1.

FIG. 2 illustrates a bottom emission type display device which was made to ensure the effect of the present invention.

As for the lower electrode 115, a film, which has 100 nm thickness, of In—Zn—O (hereinafter abbreviated as IZO film) was formed by means of a sputtering process. This film acts as the lower electrode 115, and is an amorphous oxide film. The film was formed in a similar condition to that of the example shown in FIG. 1. The electron injection layer 124, the electron transport layer 123, the organic light emitting layer 122, the hole transport layer 121, and the hole injection layer 129 were laminated on the lower electrode 115 in this order. Thus, the lamination order from the lower electrode 115 to the upper electrode 125 of this configuration is arranged inversely with respect to that of the configuration in FIG. 1.

The materials, the conditions for film formation, and the thicknesses of the respective layers are similar to those of the example shown in FIG. 1. The upper electrode 125 is an Al film formed by means of EB evaporation. Its pattern is formed using a shadow mask, and the thickness was set to 100 nm. Since the upper electrode 125 in the bottom emission type display device is made of metal, the rise of the light emission voltage due to oxidation of the organic film does not occur during the formation of the upper electrode. This element is referred to as an element 1'.

The voltage ratio of the element 1 to the element 1' during light emission of 100 $cd/cm^2$ was 1.3.

Figure 8:
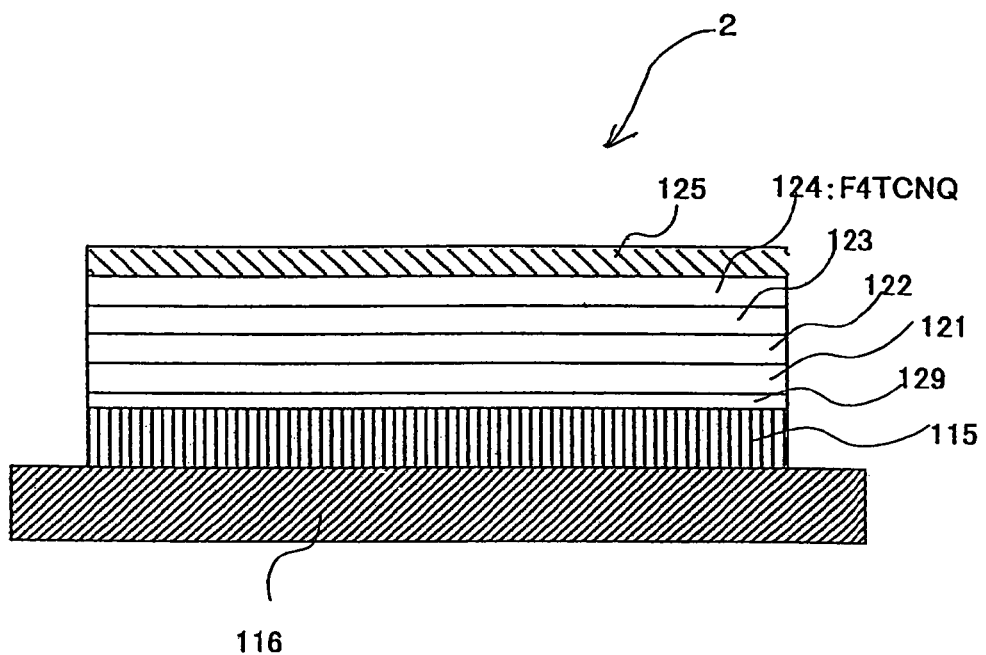
FIG. 8 is a sectional view showing another example of an organic light emitting display device according to the present invention.
Figure 9:
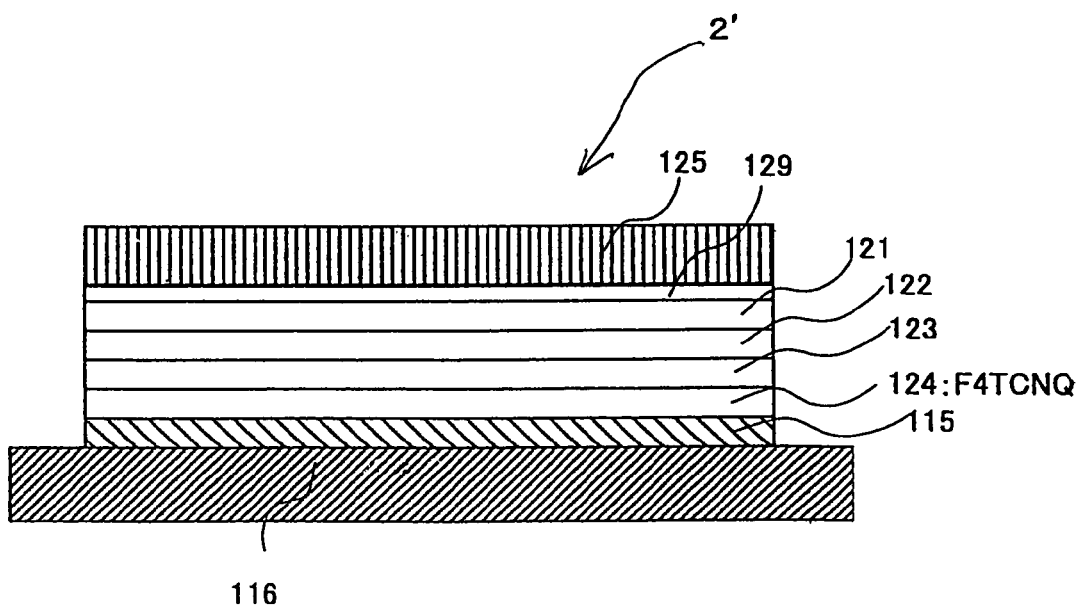
FIG. 9 is a sectional view showing one example of a bottom emission type organic light emitting display device for comparison to FIG. 8.

As a comparative example, an element 2, which is illustrated in FIG. 8, was made in a similar manner to the above-mentioned element 1, shown in FIG. 1, except for using F4-TCNQ having a cyano group as an electron injection layer 124, and an element 2', which is illustrated in FIG. 9, was made in a similar manner to the above-mentioned element 1', shown in FIG. 2, except for using F4-TCNQ as an electron injection layer 124. The voltage ratio of the element 2 to the element 2' during light emission of 100 $cd/cm^2$ was 2.0.

In this manner, as in the case of the present invention, an organic layer using an organic material that has a heterocyclic group containing one or more nitrogen atoms is included between the upper electrode 125 and the organic light emitting layer 122. Thus, the above-mentioned organic layer of the present invention including an organic material that has a heterocyclic group containing one or more nitrogen atoms is the electron injection layer 124 or the electron transport layer 123.

Since such an organic layer is included between the upper transparent electrode and the organic light emitting layer, the organic film can be prevented from the oxidization due to oxygen radicals produced during the formation of the upper electrode film, thereby reducing the increase of the light emission voltage.

As for the heterocyclic group including one or more nitrogen atoms having such an effect, oxazole, oxaziazole, thiazole, triazine, carbazole, imidazole, pyrazoline, triazole, isoquinoline, quinazoline, and phenanthroline are included other than quinoline used in the above-mentioned electron injection layer, but the heterocyclic group is not limited to these materials.

Moreover, in the present invention, a protection layer can be provided on the upper electrode. The protection layer is formed on the upper electrode, and is used in order to prevent $H_2O$ and $O_2$ in air from entering the upper electrode or the organic layer below the upper electrode.

Specifically, the inorganic materials such as $SiO_2$, $SiN_X$, $SiO_XN_Y$ and $Al_2O_3$, and the organic materials such as polypropylene, polyethylene terephthalate, polyoxymethylene, polyvinyl chloride, polyvinylidene fluoride, cyanoethyl pullulan, polymethyl methacrylate, polysulfone, polycarbonate and polyimide are included, but the material of the protection film is not limited to these materials.

Example 2

Hereinafter, the example of the organic light emitting display device according to the present invention will be described.

Figure 3:
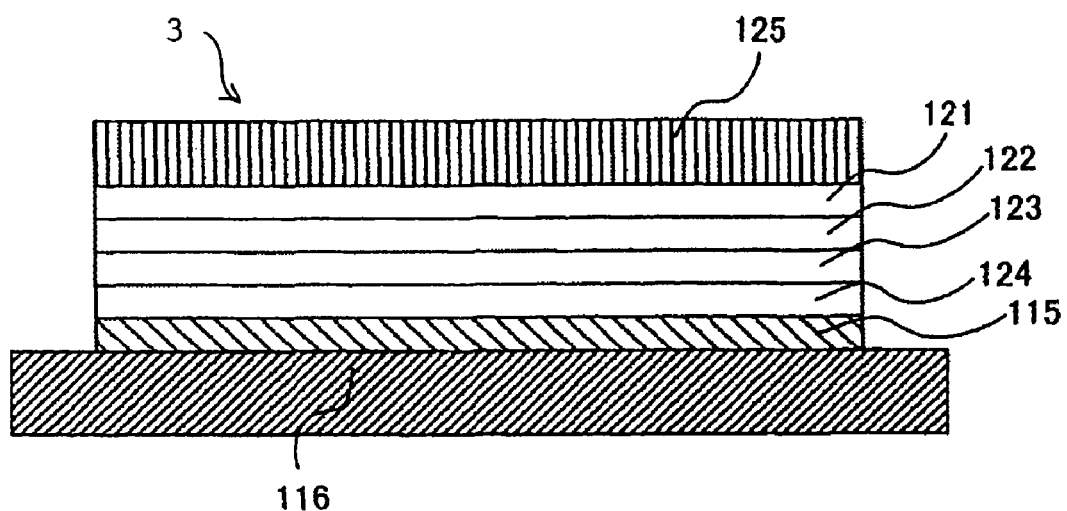
FIG. 3 is a sectional view showing another example of an organic light emitting display device according to the present invention.

FIG. 3 is a sectional view of the organic light emitting display device of this example. In the configuration of this example, the lower electrode is a cathode, and the upper electrode is an anode. In this case, the lower electrode 115, the electron injection layer 124, the electron transport layer 123, the organic light emitting layer 122, the hole transport layer 121, (the hole injection layer), and the upper electrode 125 are laminated on the substrate in this order. In the above-mentioned configuration, a configuration without the hole injection layer is described, but a configuration without the electron injection layer is also conceivable. Moreover, a configuration without the electron transport layer or the hole transport layer is also conceivable.

The present example is characterized in that the organic light emitting device includes an organic light emitting layer 122, an upper electrode 125 and a lower electrode 115 which sandwich the organic light emitting layer 122, wherein the light emitted from the organic light emitting layer is taken out from the upper electrode side, and an organic layer which is mainly composed of an organic material having a work function of 5.4 eV is included between the organic light emitting layer 122 and the upper electrode 125.

The lower electrode 115 is an Al film formed by means of EB evaporation. Its pattern was formed using a shadow mask, and the thickness was set to 100 nm. As for the cathode material used as the lower electrode, a conductive film having a small work function that enhances the injection efficiency of electrons is desirable. Specifically, aluminum, aluminum-neodium alloy, magnesium-silver alloy, aluminum-lithium alloy, aluminum-calcium alloy, aluminum-magnesium alloy, metallic calcium and cerium compounds are included, however, the cathode material is not limited to these materials.

Moreover, as for materials used as the upper electrode 125, the oxides consisting of indium oxide as a main raw material are included. Especially, $In_2O_3$—$SnO_2$ based transparent conductive film and $In_2O_3$—ZnO based transparent conductive film are desirable. As for the production processes of the transparent conductive films, a sputtering process, an opposing target type sputtering process, an EB evaporation process, and an ion-plating process are included.

Then, an Alq film, which has 10 nm thickness, doped with Li by means of a two-source simultaneous vacuum evaporation process was formed as an electron injection layer 124. The molar ratio of Alq and Li was set to 1:1. The pattern of the Alq film was formed using a shadow mask.

On the electron injection layer 124, an Alq film of 10 nm thickness was formed by means of a vacuum evaporation process. The Alq film acts as an electron transport layer 123. Its pattern was formed using a shadow mask.

On the electron transport layer 123, a co-evaporated film, which has 20 nm thickness, of tris(8-quinolinol) aluminum (hereinafter abbreviated as Alq) and quinacridone (hereinafter abbreviated as Qc) was formed by means of a two-source simultaneous vacuum evaporation process with the evaporation rate controlled at 40:1. The co-evaporated film of Alq and Qc acts as an organic light emitting layer 122. Its pattern was formed using a shadow mask.

Next, a film, which has 50 nm thickness, of 4,4-bis[N-(1-naphthyl)-N-phenylamino]biphenyl (hereinafter abbreviated as α-NPD film) was formed by means of a vacuum evaporation process. Its pattern was formed using a shadow mask. The evaporation region was 1.2 times each edge of the lower electrode. This α-NPD film acts as a hole transport layer 121. The work function of the α-NPD film is 5.5 eV.

As the upper electrode, a 100 nm thick In—Zn—O film (hereinafter abbreviated as IZO film) was formed by means of a sputtering process. This film acts as an upper electrode 125, and is an amorphous oxide film. A target with a composition of In/(In+Zn)=0.83 was used for sputtering which was carried out in an $Ar/O_2$ mixed gas atmosphere under a vacuum pressure of 1 Pa at a sputtering output of 0.2 $W/cm^2$. The upper electrode 125 consisting of the In—ZnO film acts as an anode, and its transmittance was 80%. This element is referred to as an element 3.

Figure 4:
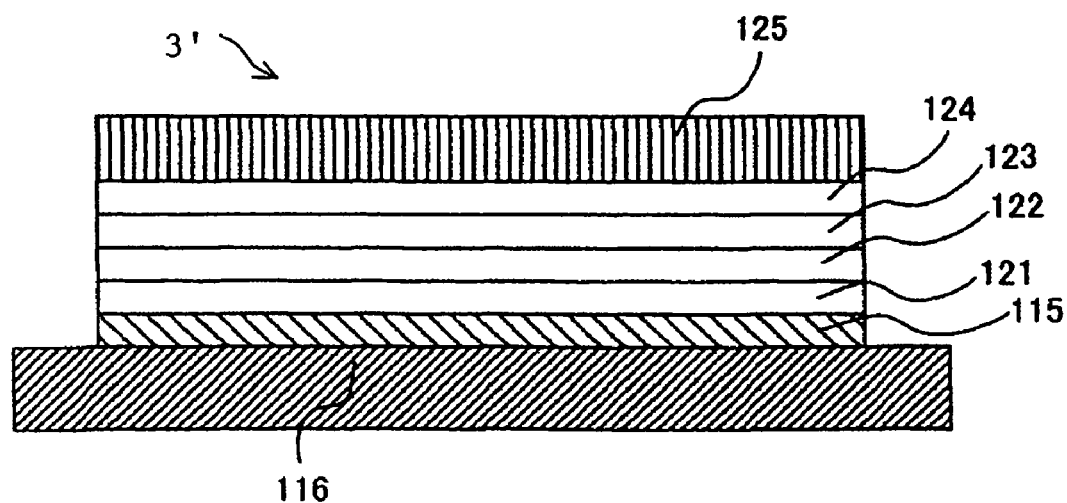
FIG. 4 is a sectional view showing one example of a bottom emission type organic light emitting display device for comparison with FIG. 3.

FIG. 4 is a view of a bottom emission type display device which was made to ensure the effect of the present invention. As for the lower electrode, a 100 nm thick In—Zn—O film (hereinafter abbreviated as IZO film) was formed by means of a sputtering process. This film acts as the lower electrode 115, and is an amorphous oxide film. The film was formed in a similar condition to FIG. 3. The hole transport layer 121, the organic light emitting layer 122, the electron transport layer 123, and the electron injection 124 were laminated on the lower electrode in this order. The materials, the conditions for the film formation, and the thicknesses of the respective layers are similar to those of the example shown in FIG. 3. The upper electrode is an Al film formed by means of EB evaporation. Its pattern was formed using a shadow mask, and the thickness was set to 100 nm. Since the upper electrode in the bottom emission type display device is made of metal, the rise of the light emission voltage due to oxidation of the organic film does not occur during the formation of the upper electrode. This element is referred to as an element 3'. The voltage ratio of the element 3 to the element 3' during light emission of 100 $cd/m^2$ was 1.5.

Figure 10:
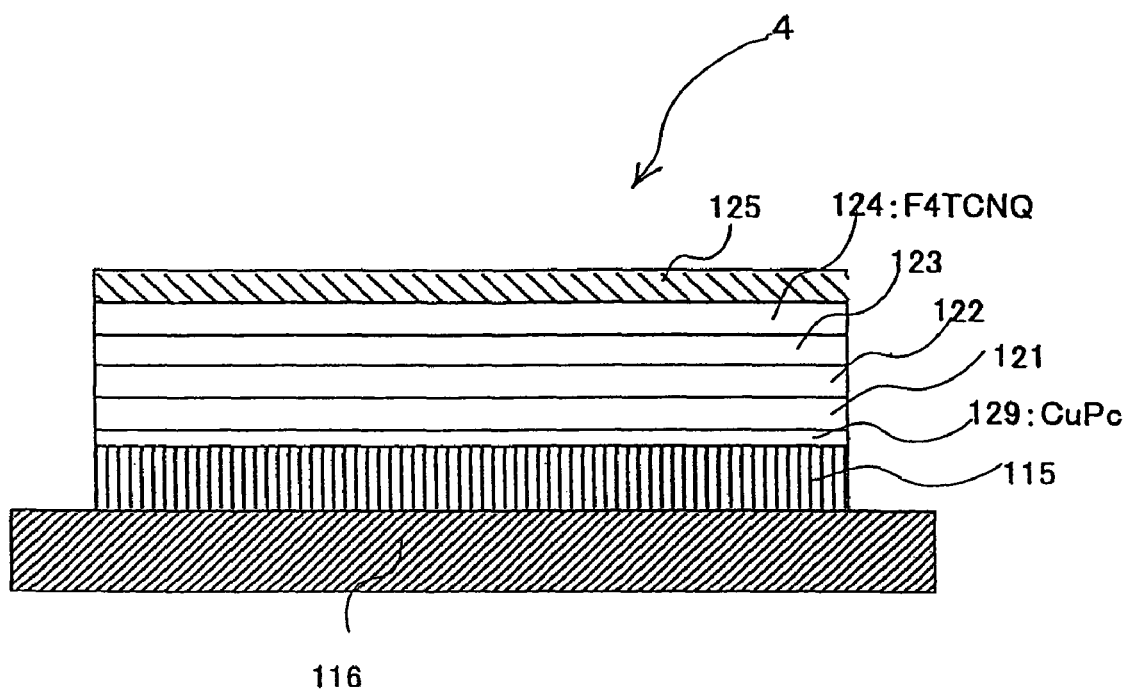
FIG. 10 is a sectional viewing showing a further example of an organic light emitting device according to the present invention.
Figure 11:
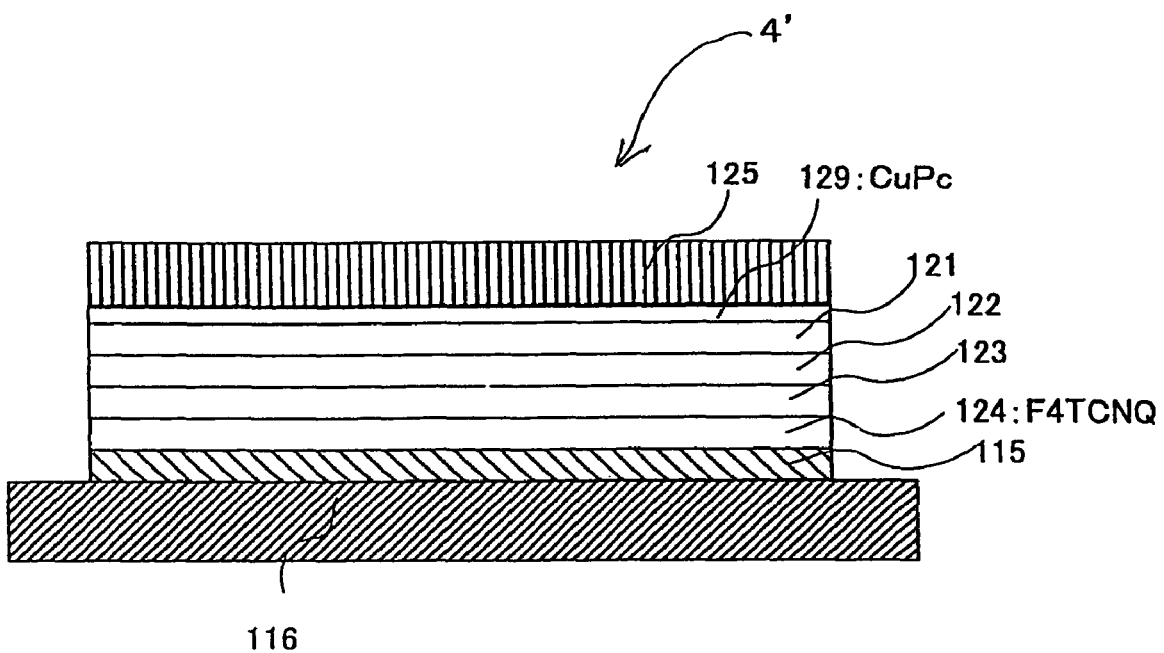
FIG. 11 is a sectional view showing a further example of a bottom emission type light emitting device for comparison to FIG. 10.

As a comparative example, an element was made in a similar manner to the element 2 in FIG. 8 except for adding copper phtalo-cyanine to the element 2 as the hole injection layer. A copper phtalo-cyanine film, which has 10 nm thickness, was formed by means of a vacuum evaporation process. The work function of copper phtalo-cyanine was 5.3 eV. Its pattern was formed using a shadow mask. This element is referred to as an element 4 which is illustrated in FIG. 10. Moreover, a bottom emission type display device was made in a similar manner to the element 2' in FIG. 9 except for forming a copper phtalo-cyanine film which has 10 nm thickness as a hole injection layer. This element is referred to as an element 4' which is illustrated in FIG. 11. The voltage ratio of the element 4 to the element 4' during light emission of 100 $cd/m^2$ was 2.0.

In this manner, an organic layer having a work function of 5.4 eV or more was arranged between the upper electrode and the organic light emitting layer. The organic layer is the hole injection layer 129 or the hole transport layer 121. Using such an organic layer, the oxidation of the organic film due to oxygen radicals produced during the formation of the upper electrode can be prevented, thereby reducing the increase of the light emission voltage.

In addition, as for organic materials having a work function of 5.4 eV or more, the various kinds of allylamine-based compounds can be chosen apart from the above αNPD. However, the above organic materials are not limited to them.

Moreover, in the present invention, a protection layer can be provided on the upper electrode. The protection layer is formed on the upper electrode, and is used in order to prevent $H_2O$ and $O_2$ in air from entering the upper electrode or the organic layer below the upper electrode.

Specifically, the inorganic materials such as $SiO_2$, $SiN_X$, $SiO_XN_Y$ and $Al_2O_3$, and the organic materials such as polypropylene, polyethylene terephthalate, polyoxymethylene, polyvinyl chloride, polyvinylidene fluoride, cyanoethyl pullulan, polymethyl methacrylate, polysulfone, polycarbonate and polyimide are included, however, the material of the protection film is not limited to these materials.

Example 3

Hereinafter, another example of the organic light emitting display device according to the present invention will be described.

Figure 5:
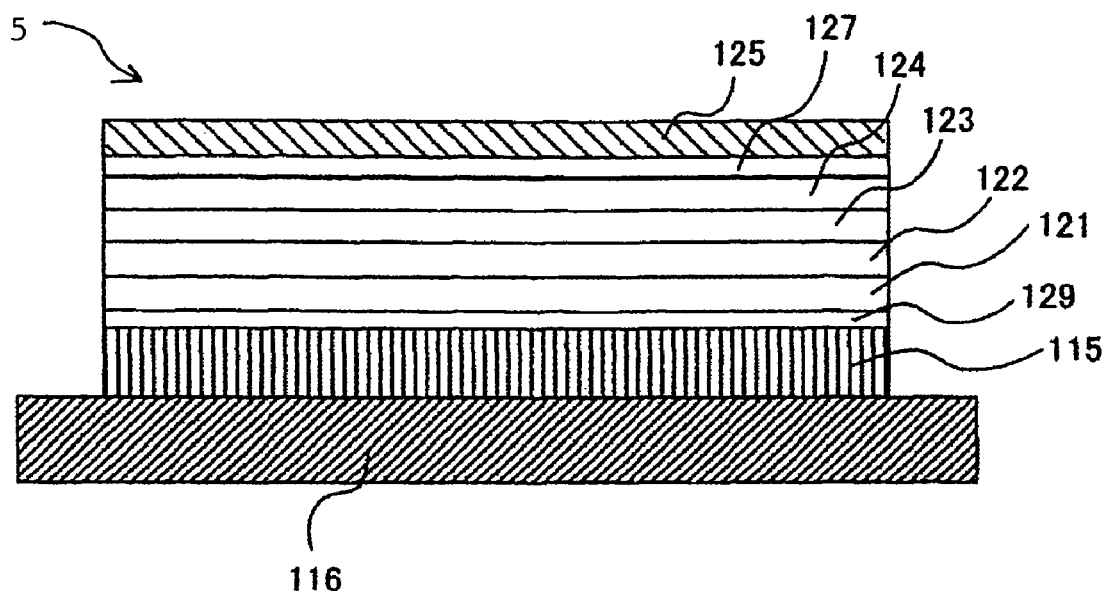
FIG. 5 is a sectional view showing another example of an organic light emitting display device according to the present invention.

The configuration of this example is the same as that of example 1 except for including a buffer layer between the upper electrode and the organic layer (FIG. 5). The buffer layer 127 was made by forming a vanadium oxide film by means of EB evaporation. Its pattern was formed using a shadow mask, and the thickness was set to be 15 nm. This element is referred to as an element 5.

Figure 12:
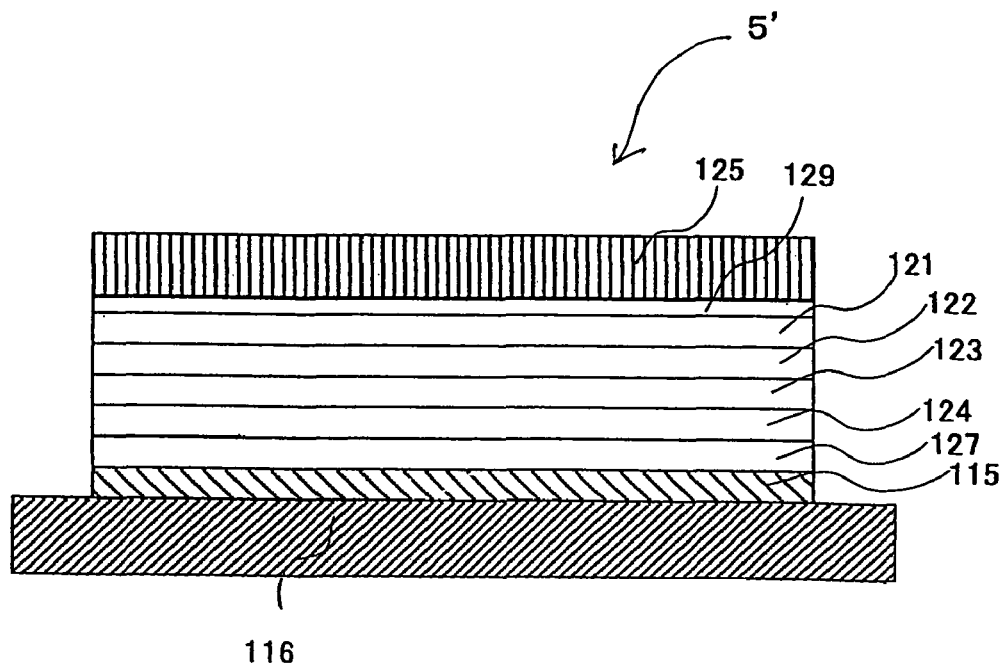
FIG. 12 is a sectional view showing another example of a bottom emission type organic light emitting device for comparison to FIG. 5.

An element 5' which is illustrated in FIG. 12 and corresponding to the element 5, shown in FIG. 5, was made in a similar manner to that of example 1, in which elements 1 and 1' in FIGS. 1 and 2 are described. The voltage ratio of the element 5 to the element 5' during light emission of 100 cd/m² was 1.0. The Gibbs energy of formation near the melting point of vanadium oxide is −1136 kJ/mol. In this manner, the increase of the light emission voltage can be suppressed by including a buffer layer 127, which is mainly composed of an oxide having a Gibbs energy of formation near its melting point less than −300 kJ/mol, between the organic layer and the upper electrode. Except for vanadium oxide, the increase of the light emission voltage can also be suppressed by using tungstic oxide, or molybdenum oxide whose Gibbs energy of formation near its melting point is −300 kJ/mol or less.

Example 4

Hereinafter, another example of the organic light emitting display device according to the present invention will be described. The configuration of this example is similar to that of example 2 except for including a buffer layer between the upper electrode and the organic layer (See FIG. 6).

The buffer layer 127 was made by forming a vanadium oxide film by means of EB evaporation. Its pattern was formed using a shadow mask, and the thickness was set to 15 nm. This element is referred to as an element 6.

Figure 6:
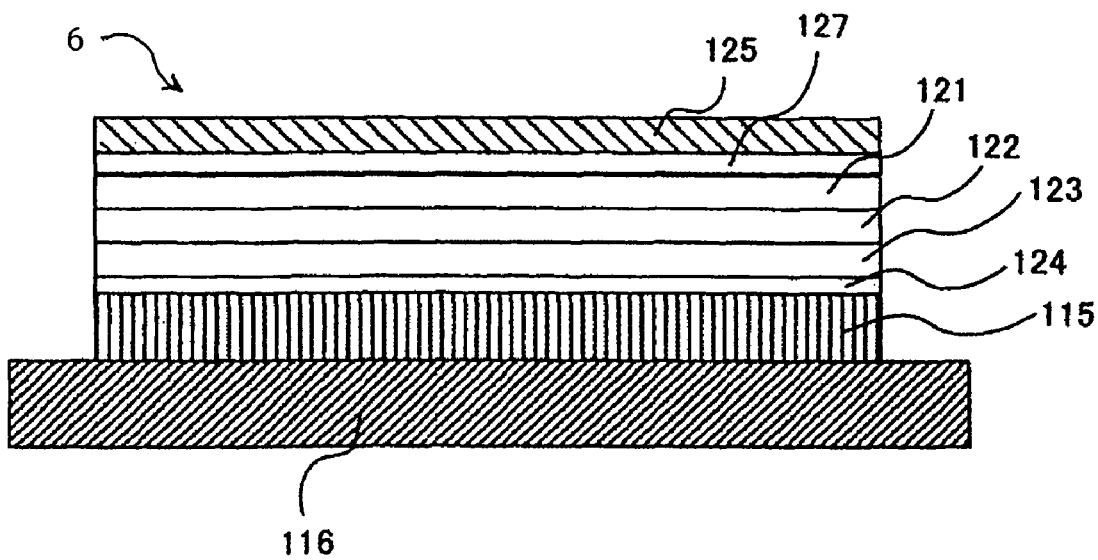
FIG. 6 is a sectional view showing still another example of an organic light emitting display device according to the present invention.
Figure 13:
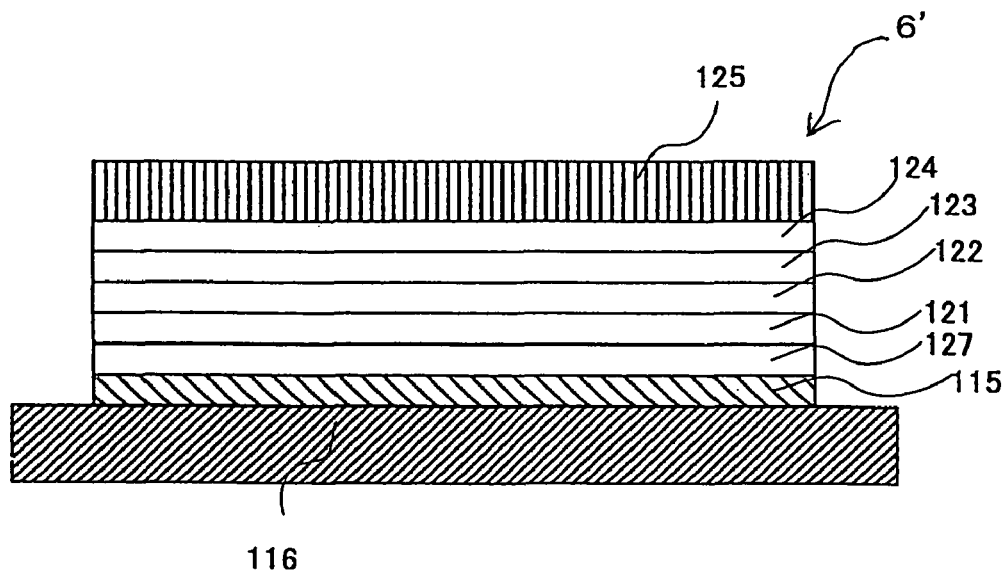
FIG. 13 is a sectional view showing still another example of a bottom emission type organic light emitting device for comparison to FIG. 6.

A bottom emission type element 6', which is shown in FIG. 13 and corresponding to the element 6, shown in FIG. 6, was made in a similar manner to that of example 2, in which elements 3 and 3' in FIGS. 3 and 4 are described. The voltage ratio of the element 6 to the element 6' during light emission of 100 cd/m² was 1.0. Moreover, except for vanadium oxide, the increase of the light emission voltage can be also suppressed by using tungstic oxide, or molybdenum oxide whose Gibbs energy of formation near its melting point is −300 kJ/mol or less.

Figure 7:
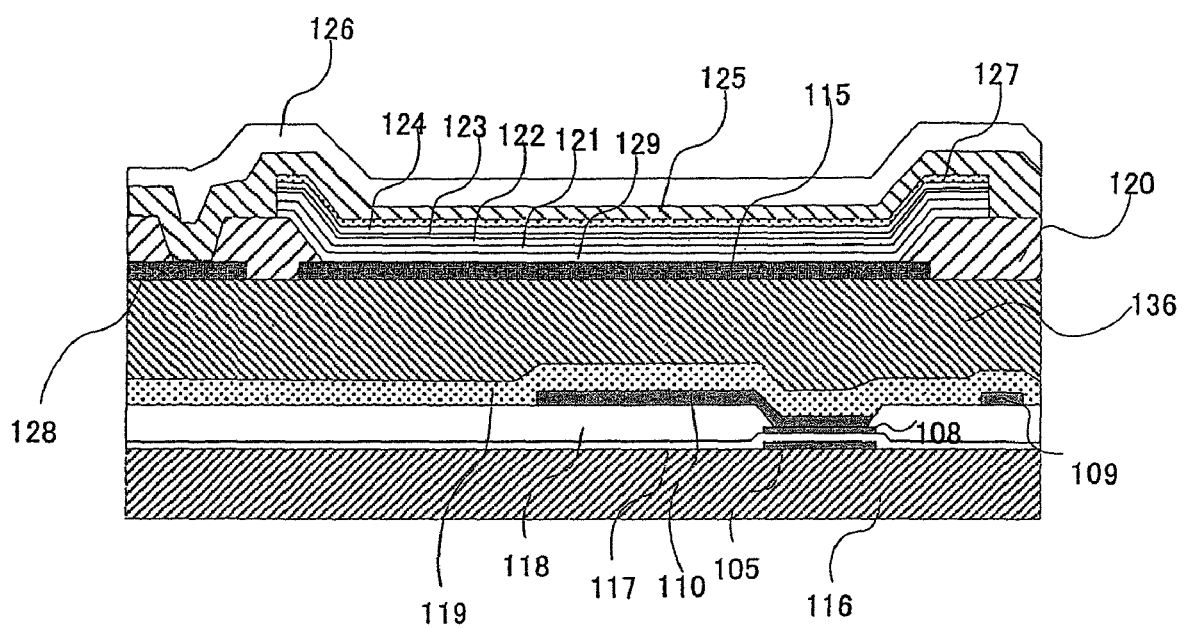
FIG. 7 is a sectional view of a pixel region showing another example of an organic light emitting display device according to the present invention.

In FIG. 7, a sectional view of the organic light emitting display device which actively drives the organic light emitting display device shown in example 1 was shown.

Hereinafter, a manufacturing method of the organic light emitting display device of this example will be described.

A amorphous silicon (a-Si) film, which has 50 nm thickness, was formed on a glass substrate 116 by means of a low pressure chemical vapor deposition LPCVD) process. Thus, the whole surface of the a-Si film was laser-annealed, whereby the a-Si film was crystallized to form poly-crystalline Si (p-Si). Next, the p-Si film was patterned by means of dry etching to form an active layer of the first transistor, an active layer of the second transistor, and a lower capacitor electrode 105.

Subsequently, a $SiO_2$ film, which has 100 nm thickness, was formed as a gate insulating film 117 by means of a plasma enhanced CVD (PECVD) process.

Then, TiW films, which have 50 nm thickness, were formed by means of a sputtering process as gate electrodes, and their patterns were formed. Moreover, the scanning line and the upper capacitor electrode 108 were also patterned.

Next, N ions were injected into the patterned p-Si layer from the top of the gate insulating film 117 by means the regions on which the gate electrodes were present, thereby resulting in active layers.

Subsequently, the substrate 116 was activated in an inert atmosphere of $N_2$ by heating so that the doping could be conducted effectively. On this substrate 116, a silicon nitride ($SiN_x$) film was formed as a first insulating interlayer 118. Its thickness was 200 nm.

Then, contact holes were formed in the gate insulating film 117 and the first insulating interlayer 118 on both ends of the active layers. Further, contact holes were also formed in the first insulating interlayer 118 on the gate electrode of the second transistor.

On the contact hole was formed an Al film which has 500 nm thickness by means of a sputtering process, and a signal line 109 and a power line 110 were formed by means of a photolithographic process. Moreover, a source electrode and a drain electrode of the first transistor, and a source electrode and a drain electrode of the second transistor, were also formed.

The lower capacitor electrode 105 and the drain electrode of the first transistor were connected. Moreover, the source electrode of the first transistor was connected to the signal line 109.

Moreover, the drain electrode of the first transistor was connected to the gate electrode of the second transistor, and the drain electrode of the second transistor was connected to the power line 110. Further, the upper capacitor electrode 108 was connected to the power line 110.

Next, a $SiN_X$ film was formed as a second interlayer insulating film 119. Its thickness was 500 nm. Contact holes were formed on the drain electrode 112' of the second transistor. On the contact holes was formed a Cr film which has 150 nm thickness by means of a sputtering process, and a lower electrode 115 was formed by means of a photolithography process on flattened layer 136. Reference 128 represents an auxiliary electrode.

Next, a positive type protection film of a light sensitive resin (PC452 produced by JSR Corp.) was formed as a third insulating interlayer 120 by means of a spin coating process, and was baked.

The third insulating interlayer 120 of PC452 had 1 μm thickness and covered the edge of the lower electrode 115 by 3 μm.

Hereinafter, the structure of the organic light emitting element forming a pixel will be described with reference to FIG. 1. The glass substrate 116 having the lower electrode 115 formed thereon was subjected to ultrasonic cleaning with acetone and then with pure water, each for three minutes, and after then spin dried.

Thus, a co-evaporated film, which has 10 nm thickness, of F4-TCNQ and copper-phthalocyanine was formed by means of a two-source simultaneous vacuum evaporation process. Its pattern was formed using a shadow mask. The molar ratio of F4-TCNQ and copper-phthalocyanine was set to 1:1. The co-evaporated film acts as a hole injection layer 129.

Subsequently, a film, which has 50 nm thickness, of 4,4-bis[N-(1-naphthyl)-N-phenylamino]biphenyl (hereinafter abbreviated as α-NPD) was formed by means of a vacuum evaporation process. Its pattern was formed using a shadow mask. The evaporation region was 1.2 times each edge of the lower electrode. This α-NPD film acts as a hole transport layer 121.

On the hole transport layer 121, a co-evaporated film, which has 20 nm thickness, of tris(8-quinolinol) aluminum (hereinafter abbreviated as Alq) and quinacridone (hereinafter abbreviated as Qc) was formed by means of a two-source simultaneous vacuum evaporation process with the evaporation rate which was controlled at 40:1. The co-evaporated film of Alq and Qc acts as an organic light emitting layer 122. Its pattern was formed using a shadow mask.

On the organic light emitting layer 122, an Alq film, which has 10 nm thickness, was formed by means of a vacuum evaporation process. The Alq film acts as electron transport layer 123. Its pattern was formed using a shadow mask.

Thus, as for an electron injection layer 124, an Alq film, which has 10 nm thickness, doped with Li by means of a two-source simultaneous vacuum evaporation process was formed. The molar ratio of Alq and Li was set to 1:1. Its pattern was formed using a shadow mask.

Subsequently, an In—Zn—O film (hereinafter abbreviated as IZO film) which has 100 nm thickness was formed by means of a sputtering process. This film acts as an upper electrode 125, and is an amorphous oxide film. As for the target, a target with a composition of In/(In+Zn)=0.83 was used. The film was formed in an $Ar/O_2$ mixed gas atmosphere under a vacuum pressure of 1 Pa at a sputtering output of 0.2 $W/cm^2$. The upper electrode 125 consisting of the In—ZnO film acts as an anode, and its transmittance was 80%.

Next, a $SiO_xN_y$ film which has 50 nm thickness was formed by means of a sputtering process. This film acts as a protection layer 126. Even in such a device, the increase of the light emission voltage can be suppressed.

The above-mentioned elements 3, 5 and 6 can also become active drive type organic light emitting devices by forming the pixel parts and the following parts of their parts so as to have the similar structures to that shown in FIG. 7, thereby, enabling to suppress the rise of the light emission voltage.

INDUSTRIAL APPLICABILITY

A high efficiency self-luminous type thin display device can be achieved by using the present invention. As a result, the present invention can be utilized for a display device such as a television, or various information terminals.

It should be further understood by those skilled in the art that although the foregoing description has been made on embodiments of the invention, the invention is not limited thereto and various changes and modifications may be made without departing from the spirit of the invention and the scope of the appended claims.

ADVANTAGE OF THE INVENTION

In such a display device, oxidation of the organic film can be reduced during the formation of the upper electrode, thereby, enabling to suppress the increase of the light emission voltage as seen in prior art structure.

The invention claimed is:
1. An organic light emitting display device comprising:
    a substrate; an organic light emitting layer; and an anode and a cathode;
    wherein the anode and the organic light emitting layer are arranged between the substrate and the cathode;
    wherein the anode is arranged between the substrate and the organic light emitting layer;
    the cathode is a transparent electrode formed of material including oxides having indium-oxide as a main raw material;
    a light emitted from the organic light emitting layer is taken out from the transparent cathode side;
    an organic layer comprising an electron injection layer or an electron transport layer, which is mainly composed of an organic material having a heterocyclic group containing one or more nitrogen atoms, is included between the organic light emitting layer and the cathode; and
    a buffer layer consisting of vanadium oxide, tungstic oxide or molybdenum oxide, which is included between the organic layer and the cathode, with the cathode directly on the buffer layer.

2. The organic light emitting display device according to claim 1, wherein the heterocyclic group containing one or more nitrogen atoms in the organic layer is selected from the group consisting of quinoline, oxazole, thiazole, triazine, carbazole, imidazole, pyrazoline, triazole, isoquinoline, quinazoline, and phenanthroline.

3. The organic light emitting display device according to claim 1,
    wherein the transparent cathode is formed by a sputtering process.

4. An organic light emitting display device according to claim 1, further comprising an insulating film,
    wherein the insulating film covers an edge of the anode.

5. An organic light emitting display device comprising a substrate; and an organic light emitting element, provided on the substrate, which comprises:
    an organic light emitting layer, an anode, a cathode, an organic layer and a buffer layer,
    wherein the organic light emitting layer is provided between the cathode and the anode,
    wherein the anode is provided between the substrate and the organic light emitting layer,
    wherein the cathode is a transparent electrode formed of material including oxides having indium-oxide as a main raw material and is provided at a side of the organic light emitting element opposite a side thereof which is provided on the substrate, a light emitted from the organic light emitting element is via the transparent cathode side thereof, wherein the organic layer comprises an electron injection layer or an electron transport layer mainly composed of an organic material having a heterocyclic group containing one or more nitrogen atoms and is provided between the organic light emitting layer and the cathode, and wherein the buffer layer consists of vanadium oxide, tungstic oxide or molybdenum oxide and is provided between the organic layer and the cathode, with the cathode directly on the buffer layer.

6. The organic light emitting display device according to claim 5, wherein the heterocyclic group containing one or more nitrogen atoms in the organic layer is selected from the group consisting of quinoline, oxazole, thiazole, triazine, carbazole, imidazole, pyrazoline, triazole, isoquinoline, quinazoline, and phenanthroline.

7. An organic light emitting display device according to claim 5, wherein the transparent cathode is formed by a sputtering process.

* * * * *